(12) United States Patent
Valdez et al.

(10) Patent No.: US 12,464,685 B1
(45) Date of Patent: **\*Nov. 4, 2025**

(54) SUBMERSIBLE NETWORKING ENCLOSURE

(71) Applicant: FRONTIER COMMUNICATIONS HOLDINGS, LLC, Dallas, TX (US)

(72) Inventors: John Valdez, Copper Canyon, TX (US); Erwin Wardojo, McKinney, TX (US)

(73) Assignee: FRONTIER COMMUNICATIONS HOLDINGS, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/773,704

(22) Filed: Jul. 16, 2024

(51) Int. Cl.
*H05K 7/20* (2006.01)

(52) U.S. Cl.
CPC ..... *H05K 7/20781* (2013.01); *H05K 7/20236* (2013.01); *H05K 7/20272* (2013.01)

(58) Field of Classification Search
CPC ........... H05K 7/20236; H05K 7/20781; H05K 7/203; H05K 7/20272
See application file for complete search history.

(56) References Cited

U.S. PATENT DOCUMENTS

| | | | | |
|---|---|---|---|---|
| 4,320,431 A | * | 3/1982 | Bell | H02K 5/1672 384/627 |
| 5,925,848 A | * | 7/1999 | Elliott, Jr. | H02G 9/10 174/50 |
| 6,407,533 B1 | * | 6/2002 | Bartek | H01M 10/6566 320/150 |
| 7,475,494 B1 | * | 1/2009 | Knight | H05K 7/1425 361/698 |
| 9,351,429 B2 | | 5/2016 | Shelnutt et al. | |
| 10,064,313 B2 | * | 8/2018 | Ishinabe | H05K 7/20781 |
| 10,528,094 B2 | | 1/2020 | Saito | |
| 10,750,637 B1 | | 8/2020 | Alissa et al. | |
| 2011/0132579 A1 | | 6/2011 | Best et al. | |
| 2014/0022708 A1 | | 1/2014 | Hyde et al. | |
| 2014/0307384 A1 | | 10/2014 | Best | |
| 2015/0181762 A1 | | 6/2015 | Boyd et al. | |
| 2016/0234970 A1 | | 8/2016 | Shelnutt et al. | |

(Continued)

FOREIGN PATENT DOCUMENTS

| | | | | |
|---|---|---|---|---|
| CN | 104380236 A | * | 2/2015 | ........... G06F 3/0481 |
| CN | 111356343 A | * | 6/2020 | ......... H05K 7/20272 |

*Primary Examiner* — Zachary Pape
(74) *Attorney, Agent, or Firm* — MARSHALL, GERSTEIN & BORUN LLP

(57) ABSTRACT

An enclosure for retaining at least one networking component may include a shell forming a first chamber and a second chamber, a dielectric fluid adapted to be disposed in the first chamber, a mounting mechanism at least partially disposed within the first chamber, a coolant distribution line at least partially disposed within the first chamber, and a coolant circulator at least partially disposed within the shell. The mounting mechanism includes at least one coupling member adapted to retain at least one active networking component. The coolant distribution line includes an elongated member having at least one opening formed on a portion thereof. The coolant circulator is adapted to circulate the dielectric fluid within the first chamber of the shell via the coolant distribution line. The mounting mechanism is adapted to be submerged in the dielectric fluid.

18 Claims, 4 Drawing Sheets

(56) References Cited

U.S. PATENT DOCUMENTS

| | | |
|---|---|---|
| 2017/0311484 A1 | 10/2017 | Ozyalcin et al. |
| 2018/0063991 A1 | 3/2018 | Hirai et al. |
| 2019/0014685 A1 | 1/2019 | So et al. |
| 2019/0223324 A1 | 7/2019 | Le et al. |
| 2019/0357385 A1 | 11/2019 | Miyazaki |
| 2020/0093037 A1 | 3/2020 | Enright et al. |
| 2020/0093038 A1 | 3/2020 | Enright et al. |
| 2020/0288600 A1 | 9/2020 | Gao |
| 2022/0104394 A1 | 3/2022 | Boyd et al. |
| 2022/0361381 A1 | 11/2022 | Sweeney et al. |
| 2022/0400577 A1 | 12/2022 | Smith |
| 2023/0042343 A1* | 2/2023 | Hashimoto ........ H05K 7/20272 |
| 2023/0225076 A1 | 7/2023 | Shah et al. |
| 2023/0254996 A1 | 8/2023 | Johnson |
| 2023/0363110 A1 | 11/2023 | Testa et al. |
| 2024/0292573 A1* | 8/2024 | Kajitani ............. H05K 7/20836 |

* cited by examiner

SUBMERSIBLE NETWORKING ENCLOSURE

FIELD OF THE DISCLOSURE

This disclosure relates generally to networking systems, and, more particularly, to submersible enclosures for networking systems.

BACKGROUND

Telecommunication networking elements may oftentimes require cooling to maintain operational specifications. Given an increase in technological demands relating to higher capacity and increased processing power, power consumption and heat output are oftentimes significantly increased.

Historically, telecommunications companies have deployed active networking equipment in outside plant (OSP) environments. When deploying sensitive active networking equipment in a digital loop carrier (DLC) cabinet, heat and power demands pose challenges, as a balance is ideally met between cooling the equipment while not overtaxing the cooling mechanism. Frequently, such elements are air-cooled using: 1) any number of suitable fans to circulate air; 2) with a heat exchanger; and/or 3) with any number of air conditioning units. However, each of these approaches relies on controlling air circulation as a primary method to remove heat from inside the cabinet or enclosure. Such approaches may consume significant amounts of energy and require relatively large enclosures to provide ample volume required for effective air cooling, thereby increasing material and equipment costs. Further, service providers may need to frequently repair and/or replace such devices, which may increase overall costs and resources.

Accordingly, there is a need for improved devices having improved functionalities.

SUMMARY

An enclosure for retaining at least one networking component may include a shell forming a first chamber and a second chamber, a dielectric fluid adapted to be disposed in the first chamber, a mounting mechanism at least partially disposed within the first chamber, a coolant distribution line at least partially disposed within the first chamber, and a coolant circulator at least partially disposed within the shell. The mounting mechanism includes at least one coupling member adapted to retain at least one active networking component. The coolant distribution line includes an elongated member having at least one opening formed on a portion thereof. The coolant circulator is adapted to circulate the dielectric fluid within the first chamber of the shell via the coolant distribution line. The mounting mechanism is adapted to be submerged in the dielectric fluid.

In some examples, the enclosure may further include a connection panel at least partially disposed in the second chamber of the shell. The connection may be accessible by a user via a door. In these and other examples, the enclosure may further include at least one transmission cable that operably couples with the at least one active networking component retained in the first chamber and the connection panel disposed in the second chamber.

In some forms, the enclosure further includes a primary power source at least partially disposed within the first chamber. The primary power source is adapted to be submerged in the dielectric fluid and to provide power to the at least one active networking component. In such examples, the enclosure may further include a secondary power source at least partially disposed within the second chamber. The secondary power source may provide power to the at least one active networking component.

In some of these approaches, the enclosure may further include an overflow assembly at least partially disposed within the first chamber. The overflow assembly may collect excess dielectric fluid disposed within the first chamber.

In some forms, the enclosure may additionally include a heat sink operably coupled with the shell that is positioned between the coolant circulator and the coolant distribution line to dissipate thermal energy from the dielectric fluid exiting the coolant circulator before entering the coolant distribution line. In these and other approaches, the enclosure may also include a flow meter operably coupled with the coolant circulator. The enclosure may additionally include an alarm member operably coupled with the flow meter.

In some aspects, a cover may be provided that seals the first chamber and the second chamber of the shell.

In accordance with a second aspect, approaches for assembling an enclosure for retaining at least one networking component are provided. These approaches may include providing a shell forming a first chamber and a second chamber, coupling a mounting mechanism with the first chamber of the shell, the mounting mechanism including at least one coupling member, disposing a coolant distribution line within the first chamber of the shell, the coolant distribution line including an elongated member having at least one opening formed on a portion thereof, coupling at least one active networking component with the mounting mechanism via the at least one coupling member, coupling a coolant circulator with the shell, and disposing a dielectric fluid within the first chamber of the shell such that the at least one active networking component is submerged by the dielectric fluid.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate examples of concepts that include the claimed invention, and explain various principles and advantages of those examples.

Figure 1:
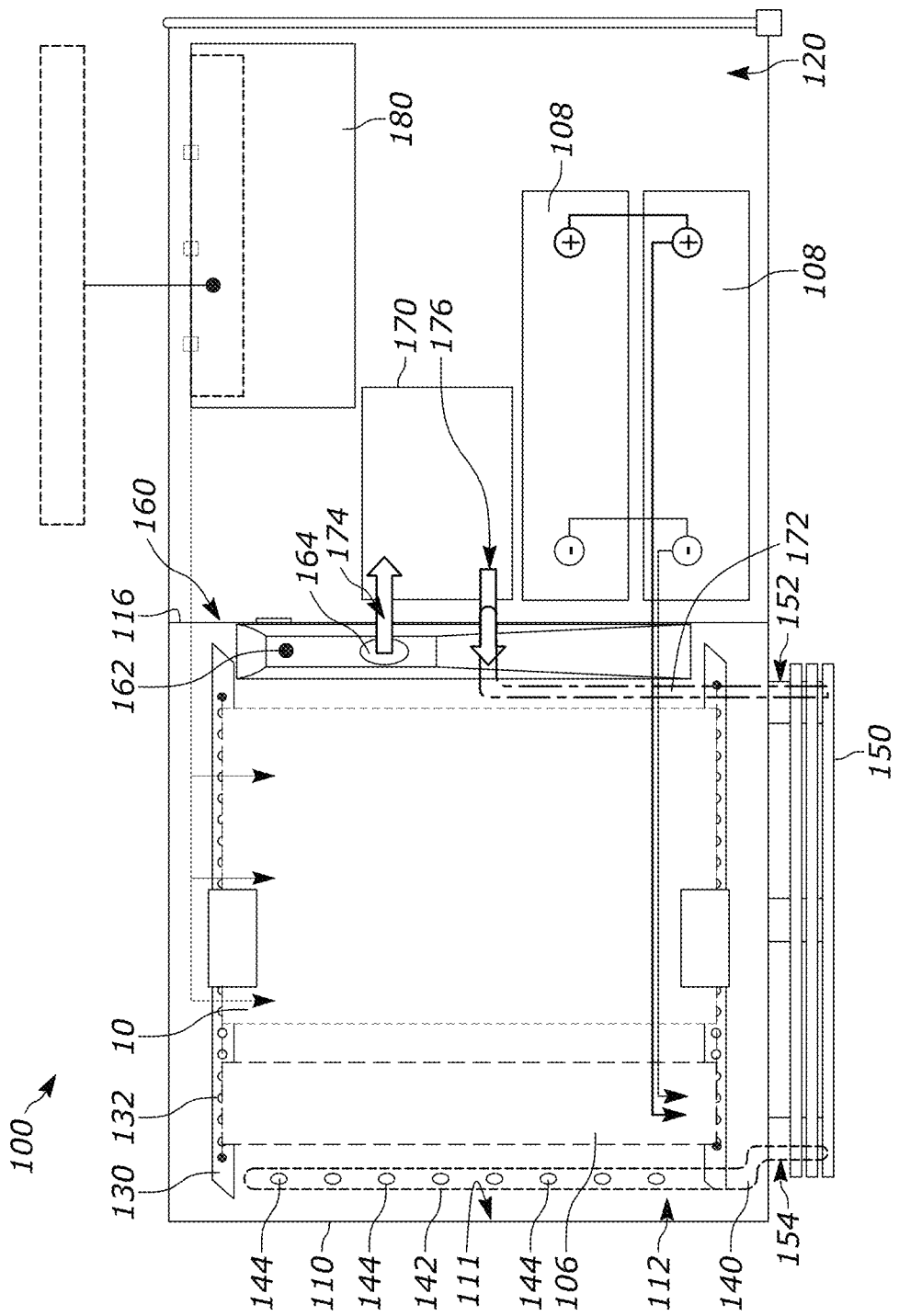
FIG. 1 is a top plan view of an example enclosure for retaining at least one networking component in which the systems, methods, and/or techniques of the present disclosure may be implemented.
Figure 2:
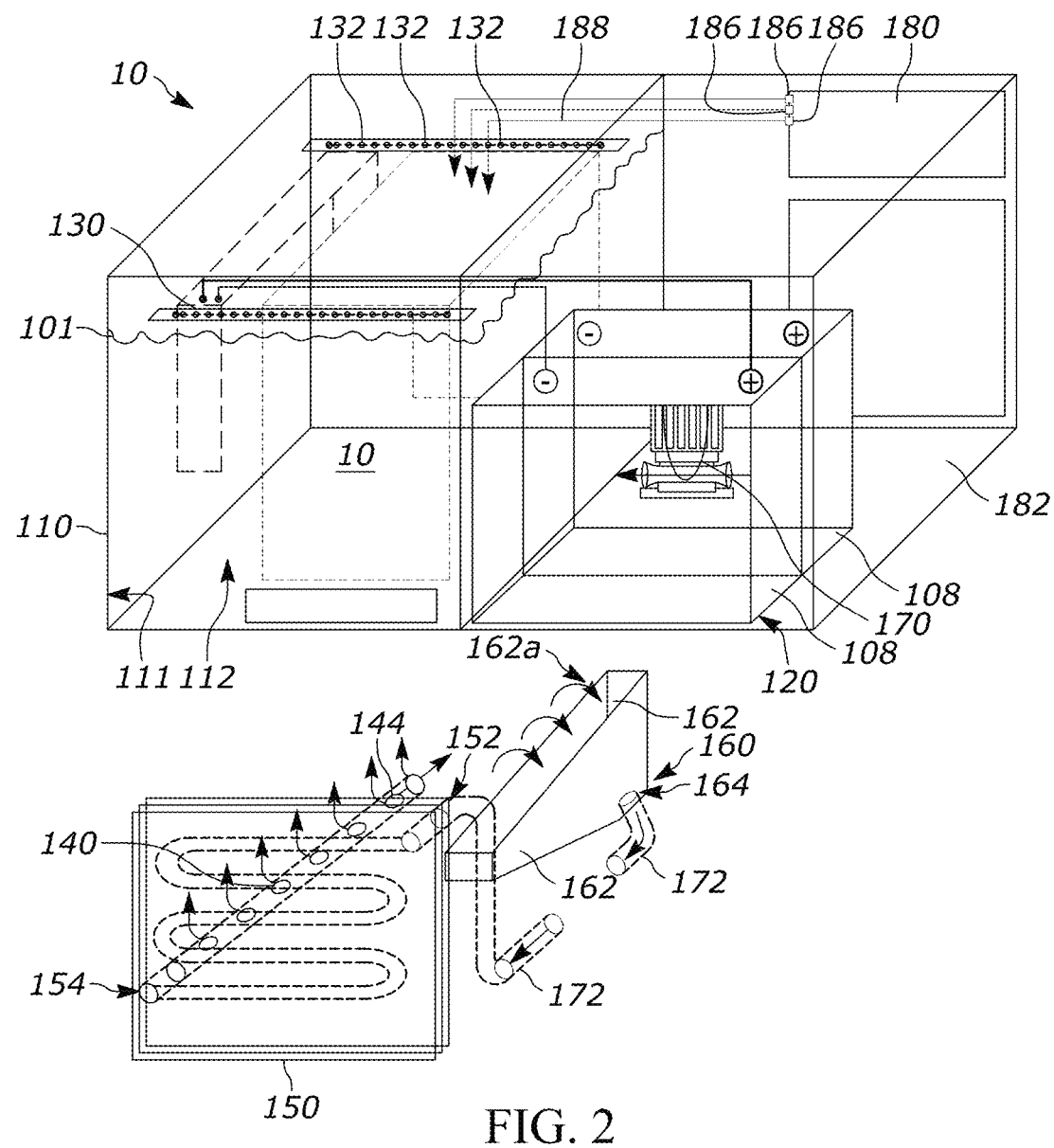
FIG. 2 is a perspective view of the example enclosure of FIG. 1 in a partially-assembled configuration in accordance with various examples.
Figure 3:
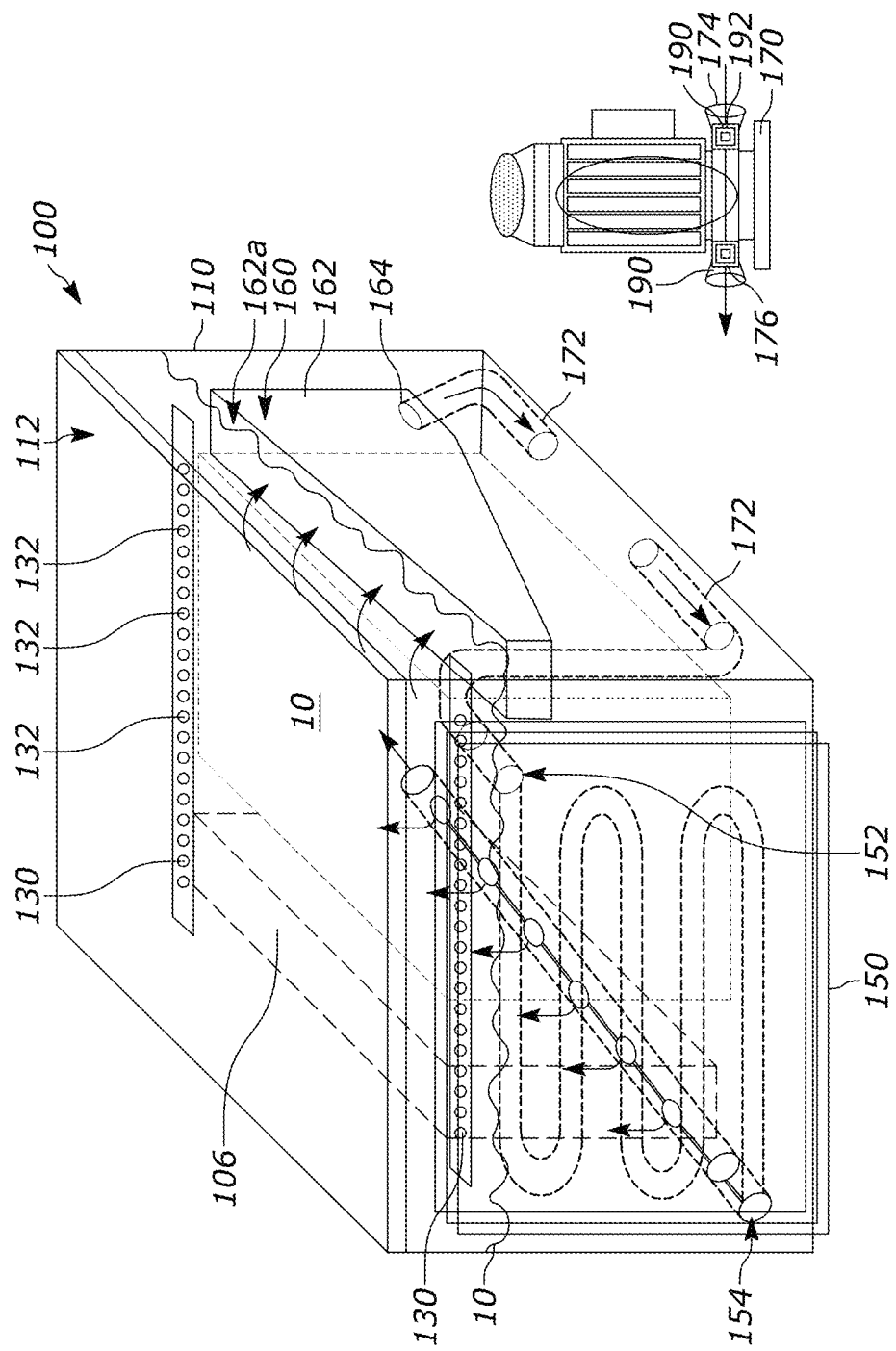
FIG. 3 is a perspective view of a portion of the example enclosure of FIGS. 1 & 2 in accordance with various examples.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples. Also, common but well-understood elements that are useful or necessary in a commercially feasible examples are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

The apparatus and method components have been represented where appropriate by conventional symbols in the drawings, showing only those specific details that are pertinent to understanding examples of the present disclosure so as not to obscure the disclosure with details that will be readily apparent to those of ordinary skill in the art having the benefit of the description herein.

Although the figures show parts with clean lines and boundaries, some or all of these lines and/or boundaries may be idealized. In reality, the boundaries and/or lines may be unobservable, blended, and/or irregular. Use of terms such as up, down, top, bottom, side, end, front, back, etc. herein are used with reference to a currently considered or illustrated orientation. If they are considered with respect to another orientation, it should be understood that such terms must be correspondingly modified.

DETAILED DESCRIPTION

Disclosed examples of the disclosure provide a number of advantages over existing techniques for retaining components of networks while providing for increased thermal dissipation. Generally speaking, a component of a network, such as, for example, a PON, as utilized herein, which may be in the form of a last mile termination unit (e.g., an optical network terminal (ONT), an optical network unit (ONU), and/or an optical line terminal (OLT)) disposed at customer premises). Such a component may be retained within an enclosure. The enclosures described herein may accommodate advanced and/or higher-powered networking components while allowing for adequate heat dissipation to reduce and/or eliminate occurrences of overheating or other damaging events. More specifically, the enclosure may incorporate multiple chambers, one of which being adapted to retain a dielectric fluid that may take advantage of thermal conductivity properties to efficiently and effectively remove thermal energy generated from the networking equipment retained within the enclosure. Additionally, by using fluid to cool the networking equipment, such fluid may provide additional and insulation protection from external forces such as accidental contact (e.g., from a vehicle hitting the enclosure) and/or from other forces such as vibrational and/or electrical shocks and/or pulses. The enclosures described herein may also allow a user (e.g., a service technician) to access, modify, and/or create data connections with the networking equipment while the networking equipment remains submerged within the dielectric fluid in its respective chamber, thereby reducing overall maintenance and/or service times while also limiting exposure to the networking equipment.

Turning now to the Figures, an enclosure 100 is provided for retaining at least one networking component 10 (e.g., an ONT, ONU, OLT, and/or any other networking devices such as transport and/or data center equipment, which may include reconfigurable optical add-drop multiplexers (ROADM), ethernet, router, and/or server devices). The enclosure 100 may include a shell 110 having a first chamber 112 and a second chamber 120 separated by a partition 116. It is to be appreciated that the shell 110 may include any number of additional chambers as desired. Generally speaking, the first chamber 112 is adapted to retain the active networking component 10 in addition to any other components that may benefit from thermal energy dissipation. In some examples, the shell 110 may be constructed from any number and/or combination of rigid, fluid impermeable materials such as, for example, metals, polymers, and or any combination of these or other suitable materials that may retain a fluid therein while restricting the fluid from leaking or otherwise flowing to an exterior region thereof. In some examples, the shell 110 may additionally include a lining 111 constructed from a fluid impermeable material such as, for example, a silicone material, a rubber material, a polymeric material, and the like. Other examples are possible. Such a lining may prevent any fluids disposed therein from inadvertently leaking from the shell 110. While the illustrated enclosure 100 is in the form of a generally rectangular box, it is to be appreciated that the enclosure 100 may take any number of suitable shapes, forms, and/or configurations. Further, in the illustrated examples, the shell 110 may have an overall length dimension between approximately 1 m-2 m, and a width dimension between approximately 0.5 m-1 m. However, other examples are possible.

The enclosure 100 further includes a mounting mechanism 130 used to couple the networking component 10 therewith. In some examples, the mounting mechanism 130 may include at least one coupling member 132 in the form of a track, rail, or similar rack member operably coupled with the shell 110 (e.g., a sidewall or floor member thereof) that may slidably receive a corresponding bracket member (not illustrated) coupled with or otherwise formed on the networking component 10. The mounting mechanism 130 may take any number of suitable shapes or arrangements to accommodate any desired quantity of networking equipment 10 having varying dimensions and/or orientations. It is to be appreciated that any number of suitable approaches may be used to couple the networking component 10 with the mounting mechanism 130.

As previously noted, the first chamber 112 may be arranged to receive any number of components (e.g., active networking components 10 and any other elements). In addition to these active networking components 10, the first chamber 112 may also be dimensioned to accommodate a primary power source 106. In some examples, the primary power source 106 may be in the form of a direct current ("DC") power supply capable of providing between approximately 200-400 Ah of power. In some approaches, Lithium Iron Phosphate (LiFePO4) battery banks may be provided. Other examples are possible, depending on the desired requirements of the enclosure 100.

The first chamber 112 accommodates a dielectric fluid 101. Advantageously, the dielectric fluid 101 remains electrically nonconductive, and as such, may allow electronic components (such as, for example, the networking component(s) 10, the primary power source 106, and/or any other desired components at least partially disposed within the first chamber 112) to be disposed therein without incurring damage thereto while transferring generated thermal energy (e.g., heat) therefrom. It is to be appreciated that any number of suitable dielectric fluids 101 may be used, such as, for example, non-compressible, isotropic, Newtonian fluids having a dielectric strength of greater than approximately 60 kV and a resistivity of greater than $1 \times 1014$. Further, the dielectric fluid 101 may have a dielectric constant between approximately 2.0 and 2.5, with a density between approximately 0.80 and 0.85 g/cc at 20° C. Further, in some examples, the dielectric fluid 101 may have a coefficient of thermal expansion between approximately 0.0007 and 0.0006 volume/C, and a thermal conductivity between approximately 0.13 and 0.16 W/mK at 60° C. Other examples are possible.

A coolant distribution line 140 is also at least partially disposed within the first chamber 112. In the illustrated examples, the coolant distribution line 140 includes an elongated member 142 having at least one opening 144 or hole formed thereon. As will be discussed in further detail herein, the coolant distribution line 140 is provided to distribute cooled dielectric fluid 101 into the first chamber 112 of the shell 110.

A heat sink 150 is also operably coupled with the shell 110. In some examples, the heat sink 150 may be in the form of a radiator having a number of fins arranged to dissipate thermal energy from the dielectric fluid 101 to an external ambient air environment. The heat sink 150 may include internal tubing and/or may define a fluid flow path that accommodates and causes the dielectric fluid 101 to flow from an inlet 152 to an outlet 154 thereof. As illustrated in the Figures, the outlet 154 of the heat sink 150 is operably coupled with the coolant distribution line 140 such that the dielectric fluid 101 enters the fluid distribution line 140 upon being thermally cooled by the heat sink 150. In some examples, the shell 110 may include an opening that allows the outlet 154 of the heat sink 150 and/or a portion of the fluid distribution line 140 to be inserted therethrough to permit the dielectric fluid 101 to enter the first chamber 112. Such an opening may be sealed via any suitable approach to prevent unintended leakage of the dielectric fluid 101. It is to be appreciated that any number of heat sinks, heat exchangers, radiators, and the like may be provided.

An overflow assembly 160 is also provided to retain and assist with circulating the dielectric fluid 101. In some arrangements, portions of the overflow assembly 160 are disposed within the first chamber 112 of the shell 110, and other portions of the overflow assembly 160 are disposed within the second chamber 120 of the shell 110. In some arrangements, the overflow assembly 160 may include a trough 162 having an open upper end 162a and an outlet 164. This trough 162 may be disposed within the first chamber 112. As will be discussed further below, the open upper end 162a of the trough 162 is arranged to receive dielectric fluid 101 having a higher thermal temperature due to being in contact with the active networking component(s) 10.

A coolant circulator 170 is provided in the form of a pumping mechanism. In the illustrated examples, the coolant circulator 170 is disposed within the second chamber 120 of the shell 110. However, in other arrangements, the coolant circulator 170 may be disposed within the first chamber 112 and/or positioned externally to the shell 112. The coolant circulator 170 includes a number of fluid lines 172 that fluidly couple components with an inlet 174 and/or an outlet 176 thereof. More specifically, in some arrangements, the outlet 164 of the trough 162 may be fluidly coupled with the inlet 174 of the coolant circulator 170 via a first fluid line 172. Further, in some arrangements, the outlet 176 of the coolant circulator 170 may be fluidly coupled with the inlet 152 of the heat sink 150 via a second fluid line 172. It is to be appreciated that the fluid lines 172 may be constructed from any number of suitable materials such as, for example, flexible tubing, rigid tubing, and the like.

Further, it is to be appreciated that in the illustrated examples, the fluid lines 172 are arranged to transfer the dielectric fluid 101 between the first chamber 112 and the second chamber 120. In such arrangements, the fluid lines 172 may be inserted through a hole or other opening (not illustrated) formed in the partition 116 which may include any number of sealing mechanisms (not illustrated) incorporated thereon to prevent unintentional leakage. In other examples, the partition 116 may include a flange or other suitable coupling mechanism (not illustrated) that receives discrete portions of the fluid lines on each side of the partition 116. Other arrangements are possible.

In addition to the coolant circulator 170, the second chamber 120 may also accommodate a secondary power source 108. In some examples, the secondary power source 108 may be in the form of a direct current ("DC") power supply capable of providing similar levels of power as the primary power source 106. In other arrangements, the secondary power source 108 may provide more or less power than the primary power source 106 as desired. In the event of damage or other disruption of power from the primary power source 106, the secondary power source 108 may be arranged to automatically begin providing power to the active networking components 10 and/or any other components of the enclosure 100. Other examples are possible, depending on the desired requirements of the enclosure 100.

The second chamber 120 of the shell 110 may also include a connection panel 180. In contrast to the components (e.g., the active networking component 10) disposed within the first chamber 112, the connection panel 180 is adapted to be accessible by a user to make necessary data connections to external equipment. Put differently, the second chamber 120 may be a "high-touch" chamber that may be readily accessible by users as needed to establish and/or modify data connections. The connection panel 180 may include any number of inputs and outputs (e.g., between approximately 24 and 200 inputs and/or outputs) as desired.

The active networking components 10 are operably coupled with the connection panel 180 via any number of transmission cables 184. For example, the transmission cable(s) 184 may be in the form of fiber optic cables, power cables, and the like. Other examples include copper cables such as ethernet Cat6, coaxial, and the like. In some arrangements, the active networking component(s) 10 may be oriented "face-up" such that the connection ports on the active networking components 10 are either not submerged within the dielectric fluid 101 or are positioned just below the height of the fluid level. So arranged, the transmission cables 184 may be easily routed from the first chamber 112 to the second chamber 120. In some examples, the partition 116 may not extend the total height of the shell 110 such that the transmissions cables 184 may be routed over the partition 116. In other examples, the partition 116 may include additional holes or openings that allow the transmission cables 184 to pass therethrough. It is to be appreciated that any number of approaches for sealing the opening(s) to prevent the dielectric fluid 101 from entering the second chamber 120 may be provided.

The connection panel 180 may include any number of ports or couplings 186 as desired to allow for data transmission to the active networking component(s) from an external environment and vice-versa. Generally, the connection panel 180 provides networking connectivity originating from a serving central office (CO). Such networking connectivity typically is provided via fiber optics cables. Further, the connection panel 180 may also provide outbound networking connectivity to customer-facing outside plant hubs. The connection panel 180 may operate as a demarcation point to provide cross-connections. In some examples, the connection panel 180 may be arranged such that the couplings 186 are disposed through an opening of the second chamber 120 of the shell 110 such that the shell 110 needn't be opened to access such ports. However, in other examples, the couplings 186 of the connection panel 180 may be disposed within the second chamber, and may be accessible via a door 182 that provides access to the second chamber 120 of the shell 110. In some examples, the door 182 may selectively provide access to the first chamber 112 of the shell 110. In other examples, a separate door (not illustrated) may be provided to ensure the first chamber 112 remains "low-touch" and is not opened or otherwise unnecessarily accessed.

In operation, a user (e.g. a service technician) may dispose the shell 110 in a desired off-site location, then place various components (e.g., the active networking component(s), the primary power source 106, the secondary power source 108, the overflow assembly 160, the coolant circulator 170, and/or the connection panel 180) within the respective first chamber 112 and/or the second chamber 120 while making any necessary connections using power and/or transmission cables 168. The dielectric fluid 101 may then be added to the first chamber 112, whereupon the first chamber 112 may be sealed using a door, lid, and/or any other suitable approach. It is to be appreciated that in some examples, the active networking component(s) 10 may be submerged within the dielectric fluid 101 prior to coupling the transmission cable(s) 168 therewith to assist with eliminating air bubbles. After the desired power and/or data connections are established, a user may activate the coolant circulator 170 and close the door 162.

The dielectric fluid 101 is routinely (e.g., periodically and/or constantly) cycled through the first chamber 112 via the coolant circulator 170. Thermally cooled dielectric fluid 101 enters the first chamber 112 via the coolant distribution line 140, whereupon it exits the elongated member 142 via the holes 144. The cooled dielectric fluid 101 then contacts the active networking component(s) 10, thereby drawing thermal energy therefrom to assist with effectively lowering the operating temperature of the active networking component(s). Because dielectric fluid 101 having a relatively higher temperature will rise, and because the volume of dielectric fluid 101 added to the first chamber 112 is greater than the upper height of the trough 162, the heated dielectric fluid 101 rises to the top of the first chamber 112 and cascades over the open upper end 162a of the trough 162.

The dielectric fluid 101 within the trough 162 then exits the trough 162 via the outlet 164, and travels (via fluid lines 172) to the inlet 174 of the fluid circulator 170. The coolant circulator 170 then forces or otherwise urges the dielectric fluid 101 through the outlet 176 and to the inlet 152 of the heat sink 150. The fluid circulator 170 urges this dielectric fluid 101 through the heat sink, which effectively dissipates thermal energy retained within the dielectric fluid 101. Last, the cooled dielectric fluid 101 exits the outlet 154 of the heat sink 150 and enters the coolant distribution line 140, where it continues the cycle of removing thermal energy created by the active networking component(s) as it passes by the equipment. As mentioned, this cooling process may be continuous, on-demand, and/or conducted at any desired interval.

In some arrangements, it is to be appreciated that some of the equipment may require slight modifications to ensure effective operation in a submerged environment. For example, some active networking component(s) 10 and/or power sources (e.g., the primary power source 106) may incorporate fans or other active cooling mechanisms that needn't operate given the use of liquid cooling approaches described herein. In such examples, a user may disable and/or program the electronics in a way that the component "thinks" the fan is operational despite being disengaged and/or otherwise deactivated. As a non-limiting example, the fans may be removed from the components, and relevant breakers and/or fuses may subsequently be shorted or otherwise disconnected to allow the components to work in a submerged environment. Other examples are possible.

In some examples, the enclosure 100 may be relatively maintenance-free after an initial installation process. For example, the coolant circulator 170 may use a replaceable filter member (not illustrated). In some examples, to ensure longevity of the coolant circulator 170, the filter and/or dielectric fluid 101 may be replaced after a brief installation period to accommodate for buildup of particles. After this initial installation period, the enclosure 100 may be capable of operating without user intervention for extended periods (e.g., approximately 20 years or more). However, it is to be appreciated that a user may access the "dry-side" components (e.g., those retained within or otherwise coupled with the second chamber 120) as needed to establish or modify connections or to swap out components. Such tasks will advantageously limit or avoid exposure to the "wet-side" components (e.g., those retained within or otherwise coupled with the first chamber 112) so as to limit unintended damage thereto.

So arranged, by forcing the dielectric fluid 101 (which has a greater thermal density and thus increased capacity to retain heat compared with forced air approaches) past the active networking components 10, the overall size of the enclosure 100 may be reduced. Additionally, such reduced enclosure 100 size, combined with the use of liquid cooling approaches, may reduce power consumption by up to approximately 50% as compared with conventional cooling approaches.

In some implementations, the enclosure 100 may include additional components that may assist with cooling the components and/or dielectric fluid 101. For example, any number of flow meters 190 may be coupled with the coolant circulator 170 to monitor the flow rate of the dielectric fluid 101. In the event the flow meter 190 senses a flow value outside of an acceptable threshold, the flow meter 190 may trigger an alarm 192 to alert the user of an issue. Other examples and/or arrangements are possible.

Figure 4:
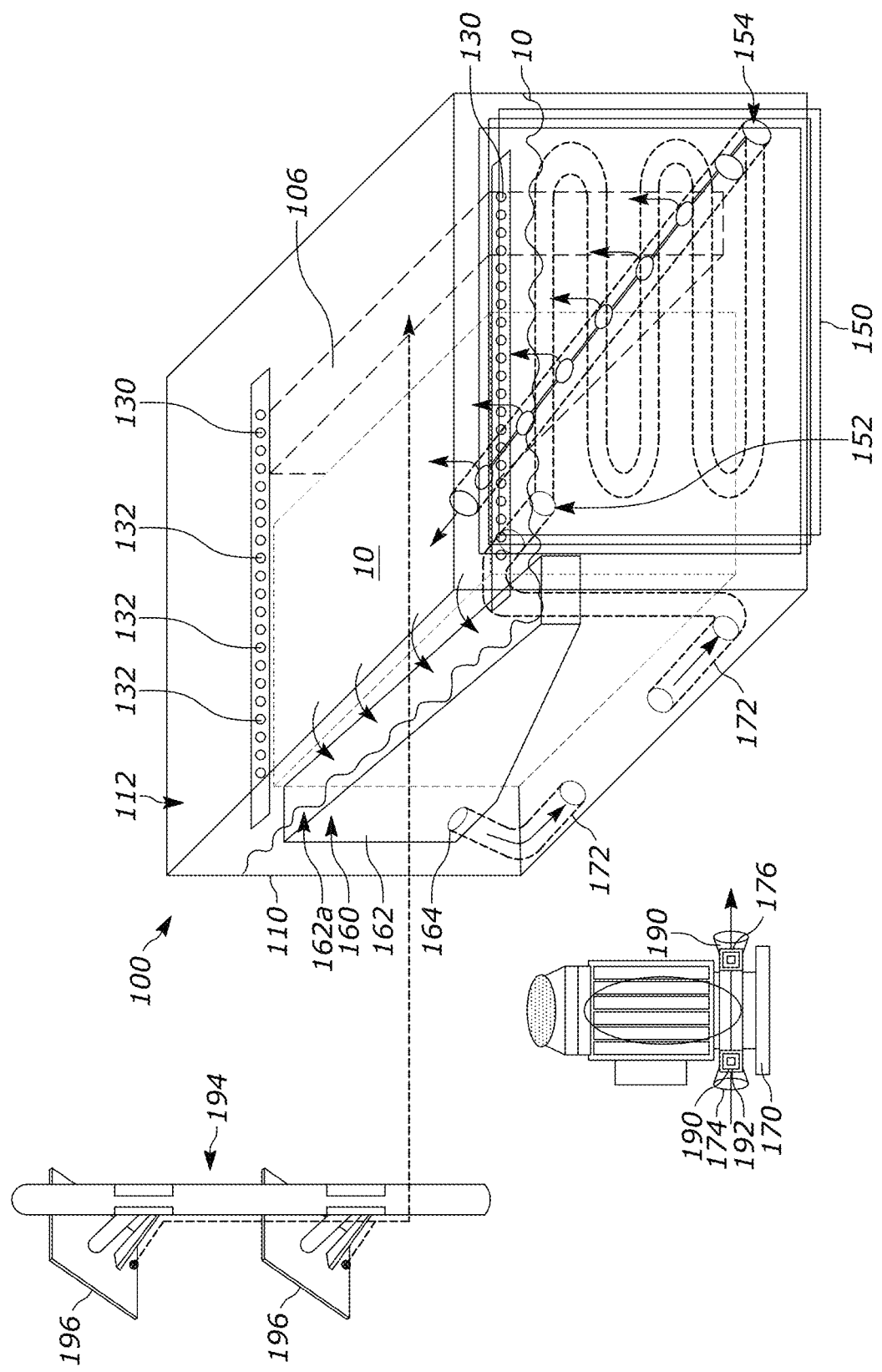
FIG. 4 is a perspective view of a portion of the example enclosure of FIGS. 1 & 2 having an alternative power supply coupled therewith in accordance with various examples.

Further, with reference to FIG. 4, in some arrangements, the enclosure 100 may be powered using a solar power maximum power point tracking (MPPT) system. In such arrangements, a solar power system 192 may include any number of solar panels 194 that are operably and/or electrically coupled with the primary power source 106. In some examples, a MPPT solar regulator may simulate the load required by the solar panel to achieve the maximum power from the primary power source 106. Such a system will determine at which point the primary power source 106 outputs the maximum power, and derive from this the voltage and current outputs required for maximum power to be achieved. In such arrangements, the secondary power source may or may not be provided as desired.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Numerous alternative examples could be implemented, using either current technology or technology developed after the filing date of this patent, which would still fall within the scope of the claims. Additionally, the described embodiments/examples/implementations should not be interpreted as mutually exclusive and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way, but may also be configured in ways that are not listed.

Further, unless expressly stated to the contrary, "or" refers to an inclusive or and not to an exclusive or. For example, "A, B or C" refers to any combination or subset of A, B, C such as (1) A alone, (2) B alone, (3) C alone, (4) A with B, (5) A with C, (6) B with C, and (7) A with B and with C. As used herein, the phrase "at least one of A and B" is intended to refer to any combination or subset of A and B such as (1) at least one A, (2) at least one B, and (3) at least one A and at least one B. Similarly, the phrase "at least one of A or B" is intended to refer to any combination or subset of A and B such as (1) at least one A, (2) at least one B, and (3) at least one A and at least one B.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, with each claim standing on its own as a separately claimed subject matter.

By way of example, and not limitation, the disclosure herein contemplates at least the following examples:

1. An enclosure for retaining at least one networking component, the enclosure comprising: a shell including a rear wall, a first sidewall, a second sidewall, an upper wall, and a lower wall that cooperate to retain the at least one networking component; a cover adapted to operably couple with the shell to define an interior volume; at least one venting member defined by a portion of the shell to permit airflow from the interior volume to an exterior environment; at least one networking component mounting member adapted to retain the at least one networking component; and a structure mounting member at least partially disposed on an outer surface of the shell to secure the shell with a portion of a structure.

2. The enclosure of example 1, further comprising a connection panel at least partially disposed in the second chamber of the shell, the connection adapted to be accessible by a user via a door.

3. The enclosure of example 2, further comprising at least one transmission cable, the at least one transmission cable adapted to operably couple with the at least one active networking component retained in the first chamber and the connection panel disposed in the second chamber.

4. The enclosure of any one of examples 1-3, further comprising a primary power source at least partially disposed within the first chamber, the primary power source adapted to be submerged in the dielectric fluid and to provide power to the at least one active networking component.

5. The enclosure of example 4, further comprising a secondary power source at least partially disposed within the second chamber, the secondary power source adapted to provide power to the at least one active networking component.

6. The enclosure of any one of examples 1-5, further including an overflow assembly at least partially disposed within the first chamber, the overflow assembly adapted to collect excess dielectric fluid disposed within the first chamber.

7. The enclosure of any one of examples 1-6, further including a heat sink operably coupled with the shell, the heat sink positioned between the coolant circulator and the coolant distribution line to dissipate thermal energy from the dielectric fluid exiting the coolant circulator before entering the coolant distribution line.

8. The enclosure of any one of examples 1-7, further including a flow meter operably coupled with the coolant circulator.

9. The enclosure of example 8, further including an alarm member operably coupled with the flow meter.

10. The enclosure of any one of examples 1-9, further including a cover adapted to seal the first chamber and the second chamber of the shell 11. A method of assembling an enclosure for retaining at least one networking component, the method comprising providing a shell forming a first chamber and a second chamber; coupling a mounting mechanism with the first chamber of the shell, the mounting mechanism including at least one coupling member; disposing a coolant distribution line within the first chamber of the shell, the coolant distribution line including an elongated member having at least one opening formed on a portion thereof; coupling at least one active networking component with the mounting mechanism via the at least one coupling member; coupling a coolant circulator with the shell; disposing a dielectric fluid within the first chamber of the shell such that the at least one active networking component is submerged by the dielectric fluid.

12. The method of example 11, further including providing power to the at least one active networking component and the coolant circulator such that the dielectric fluid flows through the coolant distribution line.

13. The method of example 11 or 12, further comprising communicatively coupling, via a transmission cable, the at least one active networking component with a connection panel at least partially disposed in the second chamber of the shell.

14. The method of any one of examples 11-13, further comprising disposing a primary power source within the first chamber such that it is submerged in the dielectric fluid, the primary power source adapted to provide power to the at least one active networking component.

15. The method of example 14, further comprising disposing a secondary power source within he second chamber, the secondary power source adapted to provide power to the at least one active networking component.

16. The method of any one of examples 11-15, further comprising disposing an overflow assembly within the first chamber.

Additionally, the benefits, advantages, solutions to problems, and any element(s) that may cause any benefit, advantage, or solution to occur or become more pronounced are not to be construed as a critical, required, or essential features or elements of any or all the claims.

Finally, any references, including, but not limited to, publications, patent applications, and patents cited herein are hereby incorporated in their entirety by reference to the same extent as if each reference were individually and specifically indicated to be incorporated by reference and were set forth in its entirety herein.

The patent claims at the end of this patent application are not intended to be construed under 35 U.S.C. § 112 (f) unless traditional means-plus-function language is expressly recited, such as "means for" or "step for" language being explicitly recited in the claim(s). The systems and methods described herein are directed to an improvement to computer functionality, and improve the functioning of conventional computers.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An enclosure for retaining at least one networking component, the enclosure comprising:
    a shell forming a first chamber and a second chamber, the shell including a lining constructed from a fluid impermeable material;
    a dielectric fluid adapted to be disposed in the first chamber;
    a mounting mechanism at least partially disposed within the first chamber, the mounting mechanism including at least one coupling member adapted to retain at least one active networking component;
    a coolant distribution line at least partially disposed within the first chamber of the shell, the coolant distribution line including an elongated member having at least one opening formed on a portion thereof;
    a coolant circulator at least partially disposed within the second chamber of the shell, the coolant circulator being fluidly coupled with the first chamber of the shell and adapted to circulate the dielectric fluid within the first chamber of the shell via the coolant distribution line; and
    an overflow assembly disposed in part within the first chamber and disposed in part within the second chamber;
    wherein the mounting mechanism is adapted to be submerged in the dielectric fluid.

2. The enclosure of claim 1, further comprising a connection panel at least partially disposed in the second chamber of the shell, the connection panel adapted to be accessible by a user via a door.

3. The enclosure of claim 2, further comprising at least one transmission cable, the at least one transmission cable adapted to operably couple with the at least one active networking component retained in the first chamber and the connection panel disposed in the second chamber.

4. The enclosure of claim 1, further comprising a primary power source at least partially disposed within the first chamber, the primary power source adapted to be submerged in the dielectric fluid and to provide power to the at least one active networking component.

5. The enclosure of claim 4, further comprising a secondary power source at least partially disposed within the second chamber, the secondary power source adapted to provide power to the at least one active networking component.

6. The enclosure of claim 1, wherein the overflow assembly comprises a trough with an open upper end and an outlet, the outlet of the overflow assembly adapted to fluidly couple with an inlet of the coolant circulator.

7. The enclosure of claim 1, further including a heat sink operably coupled with the shell, the heat sink positioned between the coolant circulator and the coolant distribution line to dissipate thermal energy from the dielectric fluid exiting the coolant circulator before entering the coolant distribution line.

8. The enclosure of claim 1, further including a flow meter operably coupled with the coolant circulator.

9. The enclosure of claim 8, further including an alarm member operably coupled with the flow meter.

10. The enclosure of claim 1, further including a cover adapted to seal the first chamber and the second chamber of the shell.

11. A method of assembling an enclosure for retaining at least one networking component, the method comprising:
    providing a shell forming a first chamber and a second chamber, the shell including a lining constructed from a fluid impermeable material;
    coupling a mounting mechanism with the first chamber of the shell, the mounting mechanism including at least one coupling member;
    disposing a coolant distribution line within the first chamber of the shell, the coolant distribution line including an elongated member having at least one opening formed on a portion thereof;

coupling at least one active networking component with the mounting mechanism via the at least one coupling member;

disposing a coolant circulator within the second chamber of the shell;

fluidly coupling the coolant circulator with the first chamber of the shell;

disposing an overflow assembly partially in the first chamber of the shell and partially in the second chamber of the shell; and disposing a dielectric fluid within the first chamber of the shell such that the at least one active networking component is submerged by the dielectric fluid.

12. The method of claim 11, further including providing power to the at least one active networking component and the coolant circulator such that the dielectric fluid flows through the coolant distribution line.

13. The method of claim 11, further comprising communicatively coupling, via a transmission cable, the at least one active networking component with a connection panel at least partially disposed in the second chamber of the shell.

14. The method of claim 11, further comprising disposing a primary power source within the first chamber such that it is submerged in the dielectric fluid, the primary power source adapted to provide power to the at least one active networking component.

15. The method of claim 14, further comprising disposing a secondary power source within the second chamber, the secondary power source adapted to provide power to the at least one active networking component.

16. The method of claim 11, further comprising fluidly coupling an outlet of the overflow assembly with an inlet of the coolant circulator, the overflow assembly comprising a trough with an open upper end and the outlet.

17. The method of claim 16, wherein disposing the dielectric fluid within the first chamber of the shell comprises disposing a volume of dielectric fluid into the first chamber that is greater than an upper height of the trough.

18. The method of claim 11, further comprising electrically coupling a solar power maximum power point tracking (MPPT) system to the enclosure.

* * * * *